(12) United States Patent
Ansari et al.

(10) Patent No.: US 7,724,028 B1
(45) Date of Patent: May 25, 2010

(54) CLOCKING FOR A HARDWIRED CORE EMBEDDED IN A HOST INTEGRATED CIRCUIT DEVICE

(75) Inventors: Ahmad R. Ansari, San Jose, CA (US); Alex S. Warshofsky, Miami Beach, FL (US)

(73) Assignee: XILINX, Inc., San Jose, CA (US)

( * ) Notice: Subject to any disclaimer, the term of this patent is extended or adjusted under 35 U.S.C. 154(b) by 61 days.

(21) Appl. No.: 12/101,375

(22) Filed: Apr. 11, 2008

(51) Int. Cl.
*G06F 7/38* (2006.01)
*H03K 19/173* (2006.01)

(52) U.S. Cl. .......................................... 326/38; 716/16
(58) Field of Classification Search .............. 326/37–41
See application file for complete search history.

(56) References Cited

U.S. PATENT DOCUMENTS

| | | | |
|---|---|---|---|
| 7,222,036 B1 * | 5/2007 | Thorne ......................... | 702/79 |
| 7,242,217 B2 * | 7/2007 | van Wageningen et al. .... | 326/40 |
| 2005/0058222 A1 * | 3/2005 | Black et al. .................. | 375/316 |
| 2006/0114022 A1 * | 6/2006 | van Wageningen et al. .... | 326/40 |

OTHER PUBLICATIONS

U.S. Appl. No. 12/043,097, filed Mar. 5, 2008, Ansari, Ahmad R., et al., entitled "A Processor Block Asic Core for Embedding in an Integrated Circuit", Xilinx, Inc. 2100 Logic Drive, San Jose, California 95124.
UG200 (v1.1), "Embedded Processor Block in Virtex-5 FPGAs", Mar. 31, 2008, 323 pages, Xilinx, Inc. 2100 Logic Drive, San Jose, CA 95124.

\* cited by examiner

*Primary Examiner*—Vibol Tan
*Assistant Examiner*—Dylan White
(74) *Attorney, Agent, or Firm*—W. Eric Webostad (57) ABSTRACT

An ASIC block embedded in a host IC has a first clock domain with a first frequency of operation that is at least equal to a second frequency of operation of a second clock domain in the host IC but external to the ASIC block. FPGA logic in the second clock domain interfaces with the ASIC block; and a PLL located in the host integrated circuit but external to the ASIC block is coupled to receive a reference clock signal and configured to generate clock signals. Two of the clock signals are respectively sent to the FPGA logic and the ASIC block to make one appear to be produced earlier in time than the other with respect to the ASIC block to compensate for a clock insertion delay and for a clock-to-output time associated with the FPGA logic that at least approximates zero.

17 Claims, 4 Drawing Sheets

CLOCKING FOR A HARDWIRED CORE EMBEDDED IN A HOST INTEGRATED CIRCUIT DEVICE

FIELD OF THE INVENTION

The invention relates to integrated circuit devices ("ICs"). More particularly, the invention relates to clocking for an Application Specific Integrated Circuit ("ASIC") block embedded in a host integrated circuit device for a host IC.

BACKGROUND OF THE INVENTION

Programmable logic devices ("PLDs") are a well-known type of integrated circuit that can be programmed to perform specified logic functions. One type of PLD, the field programmable gate array ("FPGA"), conventionally includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile conventionally includes both programmable interconnect and programmable logic. The programmable interconnect conventionally includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic conventionally may be programmed by loading a stream of configuration data into internal configuration memory cells that define how the programmable elements are configured. The configuration data can be read from memory (e.g., from an external non-volatile memory, such as flash memory or read-only memory) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is conventionally stored on-chip in non-volatile memory. In some CPLDs, configuration data is stored on-chip in non-volatile memory, then downloaded to volatile memory as part of an initial configuration ("programming") sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs may include an embedded processor. Even though the example of an FPGA is used, it should be appreciated that other integrated circuits with programmable logic or integrated circuits that are at least partially programmable may be used.

Conventionally, embedded processors are designed apart from the FPGAs. Such embedded processors are thus generally not specifically designed for implementation in FPGAs, and thus such embedded processors may have operating frequencies that significantly exceed a maximum operating frequency of programmable logic. Moreover, parameters such as latency, transistor gate delay, data throughput, and the like designed into the embedded processors may be assumed to be present in the environment to which the embedded processor is coupled.

Performance of a design instantiated in programmable logic of an FPGA ("FPGA fabric") coupled to an embedded processor may be significantly limited by disparity operating parameters of the FPGA fabric and that of the embedded processor. Thus, if, as before, embedded processor interfaces, such as processor local bus ("PLB") interfaces, are brought directly out to FPGA fabric, disparity in operating parameters between the embedded processor and the FPGA fabric is a significant limitation with respect to overall performance. So an embedded processor coupled to a design instantiated in FPGA fabric may have to wait on such design instantiated in FPGA fabric, meaning the limiting factor with respect to performance was substantially due to the design instantiated in FPGA fabric. For example, accessing a memory controller instantiated in FPGA fabric coupled to the embedded processor was a significant bottleneck with respect to performance.

Alternatively, a memory controller, previously instantiated in FPGA fabric, may be hardened or provided as an ASIC core coupled to the embedded processor. By hardening a circuit previously instantiated in FPGA fabric, it is generally meant replacing or bypassing configuration memory cells with hardwired or dedicated connections. Additionally, peripherals coupled to the embedded processor may be hardened or provided ASIC cores.

However, ASIC cores, and more generally ASICs, are manufactured for high performance. More particularly, semiconductor processes and semiconductor process integration rules ("semiconductor process design rules") associated with ASICs, including ASIC cores, are generally more challenging, and thus yield for such ASIC cores may be relatively low as compared to yield of FPGAs of the same size. FPGAs, which may have a larger and longer run rate than ASICs and which may not be as performance driven, may employ semiconductor processing that is more conducive to higher die per wafer yield than ASICs.

It should be appreciated that an FPGA manufactured with an ASIC core uses FPGA semiconductor process design rules. Thus, ASIC cores manufactured in FPGAs perform worse than such ASIC cores manufactured as part of ASICs or as standalone ASICs. Thus, manufacturing FPGAs with hardwired ASIC cores would not achieve competitive performance with standalone ASICs.

Moreover, manufacturing FPGAs with hardened or ASIC core memory controllers or peripherals, or a combination thereof, would reduce flexibility of design of such FPGAs. One significant reason that users purchase FPGAs is the blank slate offered by FPGA fabric for implementing a user created circuit design. If FPGAs come with ASIC cores that take the place of some FPGA fabric resources, users may be both locked into the particular offering of hardened or ASIC core memory controllers or peripherals, and have even less flexibility of design due to fewer FPGA fabric resources for implementing their circuit design. This loss of flexibility combined with the fact that such hardened or ASIC core memory controllers or peripherals implement in FPGA fabric may be significantly slower than their standalone ASIC counterparts, would make FPGAs less attractive to users.

Accordingly, it would be desirable and useful to provide enhance performance of FPGAs without a significant loss of design flexibility.

Heretofore, performance of a design instantiated in programmable logic of an FPGA ("FPGA fabric") may be coupled to an ASIC core embedded in the host FPGA and the ASIC core having a substantially longer clock insertion delay. It should be understood that an FPGA may include a clock tree, such as an H-clock tree for example, which guarantees timing within specific parameters. However, an ASIC core is not included as part of such a clock tree, and thus conventionally such an ASIC core may have a long clock insertion delay. This clock insertion delay may therefore have to be added to a clock-to-out delay timing parameter for a design employing such an ASIC core. Having such a long clock-to-out delay parameter may inhibit performance. Moreover, in order to avoid violating hold time specifications, the short set-up time which would have been inversely associated with the long clock-to-out delay had to be artificially increased. In other words, set-up times could not be commensurately short in order to avoid having a hold time violation.

As is known, FPGAs may include phase-locked loops ("PLLs") or delay-locked loops in digital clock managers ("DCMs"). However, such PLLs may not exist as part of an ASIC core, and thus advantageously using such a PLL to reduce clock insertion delay may not be available. Furthermore, adding a PLL to an ASIC core which did not otherwise have a PLL would add significant cost.

SUMMARY OF THE INVENTION

One or more aspects generally relate to clocking for an ASIC block embedded in a host integrated circuit device for a host IC.

An aspect relates generally to a method for clock insertion delay compensation. The method includes: having an ASIC block embedded in a host integrated circuit; having a first clock domain in the ASIC block with a first frequency of operation that is at least equal to a second frequency of operation of a second clock domain in the host integrated circuit but external to the ASIC block; having FPGA logic with one or more flip-flops in the second clock domain for interfacing with the ASIC block; having a phase-locked loop ("PLL") located in the host integrated circuit but external to the ASIC block, the PLL coupled to receive a reference clock signal and configured to generate a first plurality of clock signals; sending a first clock signal of the first plurality of clock signals associated with the second clock domain to the FPGA logic; sending a second clock signal of the first plurality of clock signals associated with the first clock domain to the ASIC block; making the second clock signal appear to be produced earlier in time than the first clock signal with respect to the ASIC block to compensate for a first clock insertion delay of the ASIC block; and having a clock-to-output time associated with the one or more flip-flops that at least approximates zero.

Another aspect relates generally to a circuit, including an Application Specific Integrated Circuit ("ASIC") block embedded in a host integrated circuit; gasket logic having one or more flip-flops coupled to the ASIC block; a digital clock manager and a phase-locked loop ("PLL") located in the host integrated circuit but external to the ASIC block. The digital clock manager and the PLL are each coupled to receive a reference clock signal and configured to respectively generate a first plurality of clock signals and a second plurality of clock signals. The PLL configured is to a first clock signal of the second plurality of clock signals. A first delay is coupled to delay the first clock signal to provide a delayed version thereof for feedback input to the PLL. A second delay is coupled to delay a second clock signal of the second plurality of clock signals. The second delay is coupled to delay the second clock signal to provide a delayed version thereof for input to the gasket logic. A third clock signal of the second plurality of clock signals is provided for input to the ASIC block. The second delay is programmable for setting a delay thereof to at least approximate clock insertion delay of the third clock signal in the ASIC block.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
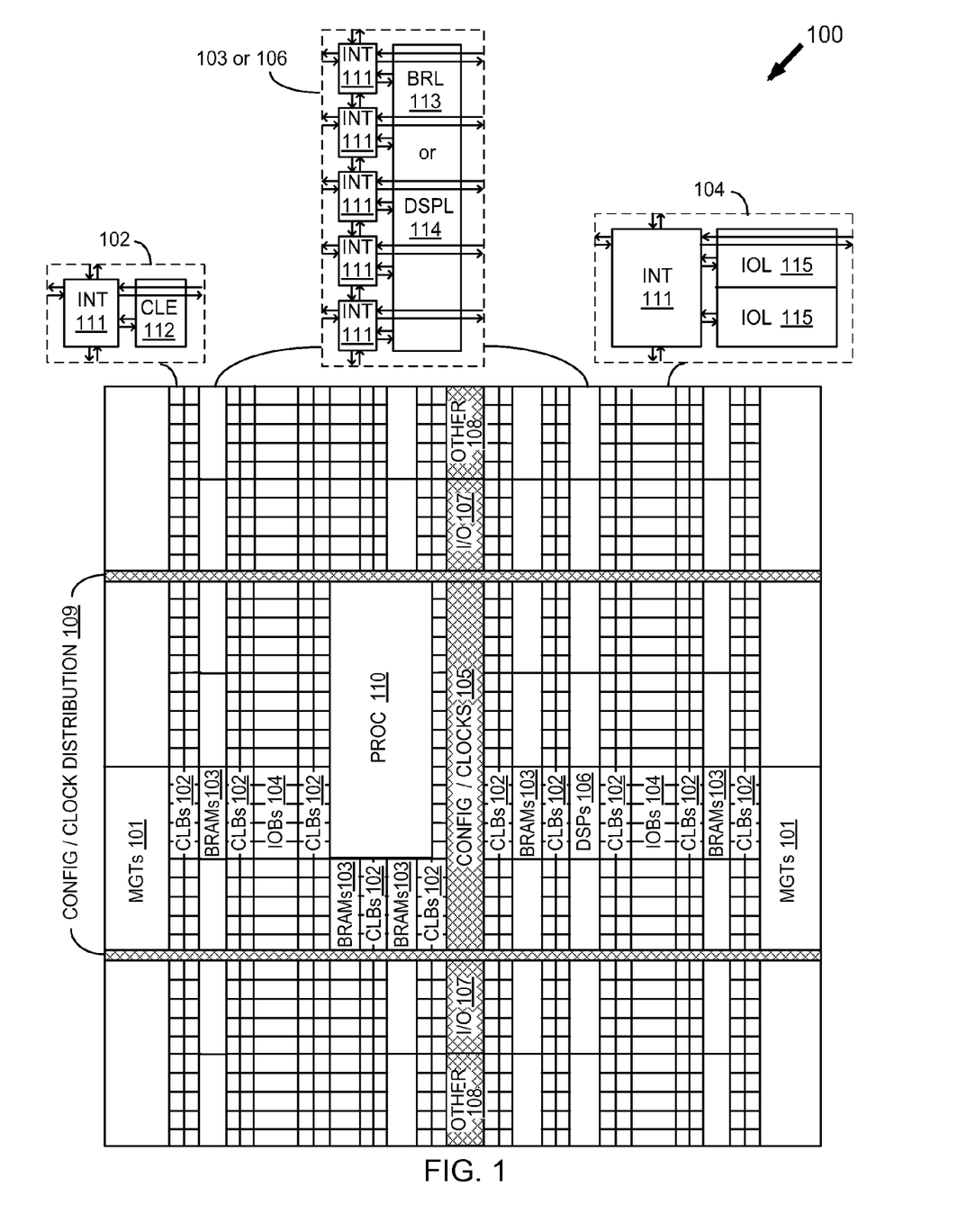
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs 101"), configurable logic blocks ("CLBs 102"), random access memory blocks ("BRAMs 103"), input/output blocks ("IOBs 104"), configuration and clocking logic ("CONFIG/CLOCKS 105"), digital signal processing blocks ("DSPs 106"), specialized input/output blocks ("I/O 107") (e.g., configuration ports and clock ports), and other programmable logic 108 such as digital clock managers, analog-to-digital converters, system monitoring logic, and so forth. Some FPGAs also include dedicated processor blocks ("PROC 110").

In some FPGAs, each programmable tile includes a programmable interconnect element ("INT 111") having standardized connections to and from a corresponding interconnect element in each adjacent tile. Therefore, the programmable interconnect elements taken together implement the programmable interconnect structure for the illustrated FPGA. The programmable interconnect element ("INT 111") also includes the connections to and from the programmable logic element within the same tile, as shown by the examples included at the top of FIG. 1.

For example, a CLB 102 can include a configurable logic element ("CLE 112") that can be programmed to implement user logic plus a single programmable interconnect element ("INT 111"). A BRAM 103 can include a BRAM logic element ("BRL 113") in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL 114") in addition to an appropriate number of programmable interconnect elements. An IOB 104 can include, for example, two instances of an input/output logic element ("IOL 115") in addition to one instance of the programmable interconnect element ("INT 111"). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

As FPGA designs increase in complexity, they reach a point at which the designer cannot deal with the entire design at the gate level. Where once a typical FPGA design comprised perhaps 5,000 gates, FPGA designs with over 100,000 gates are now common. To deal with this complexity, circuits are typically partitioned into smaller circuits that are more easily handled. Often, these smaller circuits are divided into yet smaller circuits, imposing on the design a multi-level hierarchy of logical blocks.

Libraries of pre-developed blocks of logic have been developed that can be included in an FPGA design. Such library modules include, for example, adders, multipliers, filters, and other arithmetic and DSP functions from which complex designs can be readily constructed. These pre-developed logic blocks are in the form of coded text that may be instantiated in programmable logic of the FPGA. The use of pre-developed logic blocks permits faster design cycles, by eliminating the redesign of duplicated circuits. Further, such blocks are typically well tested, thereby making it easier to develop a reliable complex design.

Thus, some FPGAs, such as the Virtex-5 FPGA available from Xilinx, Inc. of San Jose, Calif., can be programmed to incorporate pre-developed logic blocks with pre-designed functionalities, i.e., "soft cores". A soft core can include a predetermined set of configuration bits that program the FPGA to perform one or more functions. Alternatively, a soft core can include source code or schematics that describe the logic and connectivity of a design. Typical soft cores can provide, but are not limited to, DSP functions, memories, storage elements, and math functions. Some soft cores include an optimally floor-planned layout targeted to a specific family of FPGAs. Soft cores can also be parameterizable, i.e., allowing the user to enter parameters to activate or change certain soft core functionality.

A set or sets of configuration bits used to program programmable logic of an FPGA is conventionally referred to as a configuration bitstream. Programmable logic of an FPGA may include CLBs, PIPs, IOBs, or other programmably configurable logic blocks, interconnects, or inputs/outputs by a configuration bitstream. Register settings may be set via a configuration bitstream; however, hardwired registers are not programmable logic.

Moreover, a hardwired core, such as an ASIC core, is not a soft core. A soft core is instantiated in programmable logic after manufacture of an integrated circuit, whereas a hardwired core is manufactured as part of an integrated circuit. Furthermore, conventionally a hardwired core is thought of as having generally dedicated logic blocks, interconnects, and inputs/outputs, even though a portion of a hardwired core may be set to operate responsive to register settings or other means for configuration or control such as a memory setting or a control line.

Figure 2:
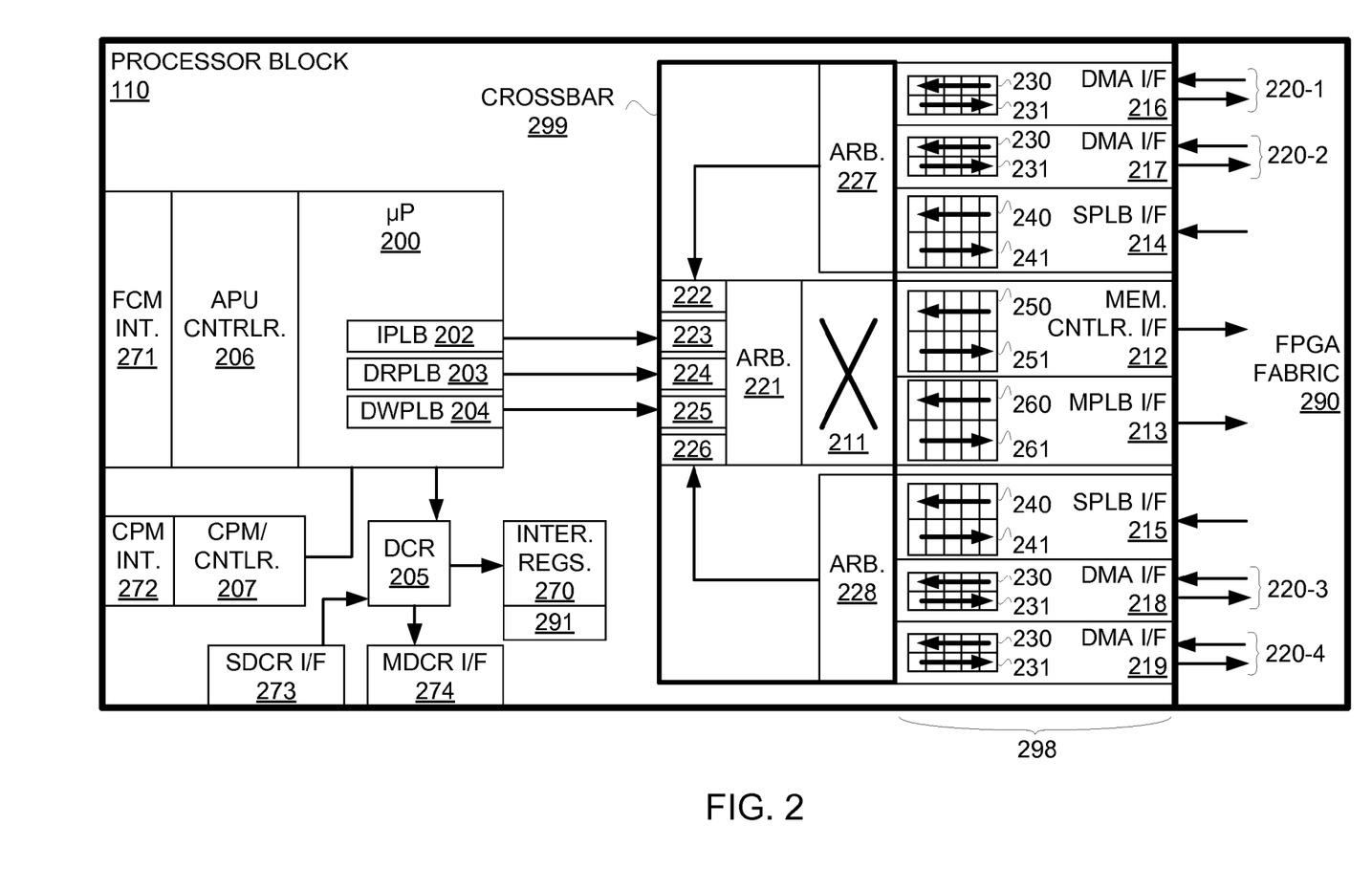
FIG. 2 is a block diagram depicting an exemplary embodiment of an ASIC processor block core ("processor block").

FIG. 2 is a block diagram depicting an exemplary embodiment of an ASIC processor block core ("processor block") 110. Processor block 110 includes an embedded microprocessor core, namely microprocessor 200, which is generally hardwired and designed apart from the FPGA, such as FPGA 100 of FIG. 1 in which processor block 110 may be located.

Microprocessor 200 in this exemplary embodiment includes an instruction processor local bus ("IPLB") 202, a data read PLB ("DRPLB") 203, and a data write PLB ("DWPLB") 204. In this exemplary embodiment, microprocessor 200 is a Power PC, or more particularly a 440 Power PC, available from IBM. However, from the following description, it should be appreciated that other types of microprocessors with other types of interfaces may be used. Moreover, from the following description, it should be appreciated that an ASIC core other than a microprocessor ASIC core may be used.

Components of processor block 110 are generally hardwired such that their performance exceeds that of programmable logic of FPGA fabric 290 to which processor block 110 is coupled. Processor block 110 includes registers, such as internal registers 270, which may be set in order to condition processor block 110 for any of a variety of user selectable configurations, as described below in additional detail.

Either or both an auxiliary processing unit ("APU") control block ("APU controller") 206 and a CPM/control block ("CPM controller") 207 may optionally be coupled to microprocessor 200 as part of processor block 110. A device control register block ("DCR") 205 may be coupled to microprocessor core 200 and may be part of processor block 110. DCR 205 may be used to provide settings to registers controlled by microprocessor core 200 or other registers subject to control by DCR block 205. DCR block 205 may be used to set registers of internal registers 270.

DCR block 205 may be coupled to a slave DCR interface ("SDCR interface") 273 and optionally a master DCR interface ("MDCR interface") 274. Thus, a user, a circuit design instantiated in FPGA 290, a microprocessor 200, or some other entity may provide register input to internal registers 270 via SDCR interface 273 subject to control of DCR 205. Alternatively, register input may be provided to SDCR interface 273 under control of DCR 205 for registers (not shown for purposes of clarity) external to processor block 110 coupled via MDCR interface 274. Such external registers may be instantiated in FPGA fabric 290.

Arrows in FIG. 2 indicate the direction of a transaction. Thus, for example, register input provided to DCR 205 may be from a transaction initiated by microprocessor 200 or from a master device (not shown for purposes of clarity) coupled to SDCR interface 273. Such transaction may pass through DCR 205 to MDCR interface 274 or to internal registers 270. One or more master devices, other than microprocessor 200, may be instantiated in FPGA fabric 290, may be other ASIC cores of FPGA 100, or may be external ICs coupled to FPGA 100, or any combination thereof. Such devices external to processor block 110 may be coupled thereto via a direct memory access ("DMA") interface block, such as DMA interface blocks ("DMA interfaces") 216 through 219, or a slave PLB interface block ("SPLB interface"), such as SPLB interfaces 214 and 215. Thus, with respect to transaction origination, DMA interfaces 216 through 219 and SPLB interfaces 214 and 215 may generally be thought of as FPGA fabric 290-to-crossbar 299 bridges, and memory controller interface block ("memory controller interface") 212 and master PLB interface block ("MPLB interface") 213 may generally be thought of as crossbar 299-to-FPGA fabric 290 bridges.

Transactions may be initiated by microprocessor 200 as indicated by arrows respectively from IPLB 202, DRPLB 203, and DWPLB 204. However, it should be understood that a transaction issued by microprocessor 200 may result in data being provided to microprocessor 200 responsive to such an issued transaction.

A crossbar 299 is part of processor block 110. Crossbar 299 includes address decoder blocks ("decoders") 222 through 226, arbitration block ("arbiter") 221, crossbar switch ("switch") 211, and arbitration blocks ("arbiters") 227 and 228. IPLB 202, DRPLB 203, and DWPLB 204 are respectively coupled to decoders 223 through 225. Decoders 222 through 226 are respectively coupled to arbiter 221. Arbiter 221 is coupled to switch 211. Decoders 222 through 226 decode addresses associated with transactions, and transactions with decoded addresses are provided to arbiter 221 for arbitrating access to switch 211. The decoded addresses for transactions having been granted access to switch 211 are used to route such transactions to memory controller interface 212 or MPLB interface 213.

Memory controller interface 212 and MPLB interface 213 are both part of processor block 110. One or more of SPLB interfaces 214 and 215 are part of processor block 110, and one or more of DMA interfaces 216 through 219 may optionally be part of processor block 110.

Memory controller interface 212 includes an inbound first-in, first-out buffer ("FIFO") 250 and an outbound FIFO 251. MPLB interface 213 includes an inbound FIFO 260 and an outbound FIFO 261. Each SPLB interface 214 and 215 includes a respective inbound FIFO 240 and an outbound FIFO 241 pair. Lastly, each DMA interface 216 through 219 includes a respective inbound FIFO 230 and outbound FIFO 231 pair. Thus, even though the direction of a transaction is directed to memory controller interface 212 or MPLB interface 213 such as originating from microprocessor 200 or FPGA fabric 290, it should be appreciated that data or other information flow associated with such a transaction may be in either or both input and output directions. Thus, crossbar 299 is bidirectional, as described below in additional detail.

Because processor block 110 is an ASIC core, blocks of processor block 110 that couple to microprocessor 200 may be tailored for interoperability as well as performance. Focusing on communication between microprocessor 200 and memory external to processor block 110, memory controller interface 212 may be designed and manufactured to operate at a rated speed of microprocessor 200. However, memory controller interface 212 may be designed and manufactured to operate at approximately ⅔ of a maximum frequency of operation of microprocessor 200. Moreover, because of hardwiring associated with an ASIC core, it should be appreciated that latency associated to signal propagation in crossbar 299 and memory controller interface 212 is substantially less than latency in FPGA fabric 290. In other words, by providing an ASIC core with memory controller interface 212 coupled to microprocessor 200, frequency of operation has been increased with a reduction in latency as compared with having microprocessor 200 directly coupled to FPGA fabric.

Furthermore, memory controller interface 212 supports various clocking ratios with respect to frequency of microprocessor 200; examples of such microprocessor-to-memory controller interface clocking ratios may include 1:1, 4:3, 3:2, and 2:1.

Effectively, by providing FIFOs 250 and 251, memory controller interface 212 is a FIFO-like port which is clocked at an operating rate of microprocessor 200 or at ⅔ of a maximum frequency of operation of microprocessor 200. There may be as little as a one clock cycle latency, subject to port availability, for sending a decoded address and transaction across crossbar 299 to memory controller interface 212. Likewise, this one clock cycle latency capability across crossbar 299 is applicable to all accesses to crossbar 299 subject to port availability, and is a latency of one clock cycle of a rated speed of operation of crossbar 299.

Thus, a user design may instantiate a memory controller in FPGA fabric 290 according to the type of memory to be coupled to such memory controller as selected by the user. Accordingly, flexibility for a user design or selection of a memory controller instantiated in FPGA fabric 290 is maintained while performance is enhanced.

PLBs of microprocessor 200 are optionally extended to FPGA fabric via ASIC circuitry provided as one or more of SPLB interfaces 214 and 215 and a MPLB interface 213. However, this is not a mere extension of PLBs of microprocessor 200 because the ASIC circuitry is not merely an extension of wires, but performs additional functions.

MPLB interface 213 operates at a fraction of the rated speed of crossbar 299, for example one half to one quarter of such rated speed of crossbar block 299. MPLB interface 213 therefore may load data into outbound FIFO 261 or unload data out of inbound FIFO 260 at the rated speed of crossbar 299, but data loaded into inbound FIFO 260 and data unloaded from outbound FIFO 261 is at the rated speed of MPLB interface 213. For purposes of clarity by way of example and not limitation, it shall be assumed that the rated speed of operation of microprocessor 200 is approximately 400 to 550 MHz, speed of crossbar 299 is approximately 266.6 to 366.6 MHz, and the speed of operation of MPLB interface 213 is approximately 133.3 to 183.3 MHz. The clock ratio of the frequency of crossbar 299 to that of MPLB interface 213 is generally an integer ratio. Frequency of MPLB interface 213, as well as SPLB interface 214 and SPLB interface 215, may have an integer dependency with respect to frequency of crossbar 299. Examples of such frequency dependency crossbar-to-PLB interface may be 1:1, 1:2, 1:3, etc. Crossbar 299 may operate at 2/N ratio with respect to frequency of microprocessor 200, for N a positive integer greater than one. Therefore, frequency of operation of MPLB interface 213, as well as SPLB interfaces 214 and 215, may have a non-integer clock ratio with respect to frequency of operation of microprocessor 200.

Accordingly, it should be appreciated that FIFOs, such as FIFOs 250, 251, 260, and 261, as well as command queues (described below in additional detail) of crossbar 299, generally represent respective pipeline channels for bridging transactions, such as from microprocessor 200 to FPGA fabric 290. PLB reading and writing initiated by microprocessor 200 may be via respective unidirectional channels; however, MPLB interface 213 is a bidirectional interface using FIFOs 260 and 261 and multiplexer circuitry (not shown for purposes of clarity). Thus, for example, an instruction fetch may be issued via IPLB 202 to memory controller interface 212 via crossbar 299 to read an instruction from memory coupled thereto via a memory controller instantiated in FPGA fabric 290, and at the same time microprocessor 200 may issue a data write via DWPLB 204 to MPLB interface 213 via crossbar 299 to write data to a peripheral device coupled thereto. This may be done concurrently through crossbar 299, as switch 211 has separate sets of connections, namely one set of connections for memory controller interface 212 and one set of connections for MPLB interface 213, such that transactions for memory controller interface 212 and MPLB 213 do not block one another. Moreover, each of these sets of connections is for a 128-bit width, and communication with and within crossbar 299 is configured for a line width of 128 bits.

In addition to memory controller interface 212, which is configurable for a user-specified memory protocol, and MPLB interface 213, which uses a PLB protocol with two separate buses for read and write, there are additional blocks that increase the interface bandwidth of processor block 110. These additional blocks may include one or more of DMA interfaces 216 through 219 and include one or more of SPLB interfaces 214 and 215. Again, each of DMA interfaces 216 through 219 includes an inbound FIFO 230 and an outbound FIFO 231, and each of SPLB interfaces 214 and 215 includes an inbound FIFO 240 and an outbound FIFO 241.

In this exemplary embodiment, DMA interfaces 216 and 217 and SPLB interface 214 are grouped together for access to decoder 222 via arbiter 227. Likewise, DMA interfaces 218 and 219 and SPLB interface 215 are grouped together for access to decoder 222 via arbiter 228. It should be appreciated that DMA protocols and PLB protocols may be used for coupling to any of a variety of peripheral devices. In this exemplary embodiment, DMAs 216 through 219 are coupled to local links 220-1 through 220-4, respectively. Each local link is a parallel but unidirectional communication bus. In other words, in this exemplary embodiment there are four output local links and four input local links. Input local links may be associated with FIFOs 230 and output local links may be associated with FIFOs 231. Transmit local links are independent of their associated receive local links. Local links are well known, and thus not described in unnecessary detail herein.

In the exemplary embodiment, clock rate of SPLB interfaces 214 and 215 is user settable to an integer ratio with respect to the frequency of operation of crossbar 299. However, the data rate of communication via local links 220-1 through 220-4 is independent of the clock rate of crossbar 299. Thus DMA interfaces 216 through 219 may be asynchronous with respect to crossbar 299; in other words no edge relationship need be present. The side of FIFOs 240, 241, 250, 251, 260, and 261 associated with FPGA fabric 290 generally has a synchronous relationship with respect to crossbar 299, and the side of FIFOs 230 and 231 associated with FPGA fabric 290 generally has an asynchronous relationship with respect to crossbar 299. For purposes of clarity by way of example and not limitation, it shall be assumed that the speed of operation of DMA interfaces 216 through 219 is approximately 200 to 250 MHz, and that the speed of operation of SPLB interfaces 214 and 215 is approximately 133.3 to 183.3 MHz.

In the exemplary embodiment of processor block 110, crossbar 299 is a five-to-two crossbar. In other words, there are five ports, respectively associated with decoders 222 through 226, for coupling to two blocks, respectively memory controller interface 212 and MPLB interface 213. Alternatively, a nine-to-two crossbar may be used or some other crossbar configuration; however, for reasons of anticipated utilization and relative clock rates, a five-to-two crossbar 299 is illustratively shown.

FIFOs of processor block 110, in addition to facilitating adaptation to differences in bandwidth, facilitate processing transactions concurrently by pipelining such transactions. As described below in additional detail, switch 211 is a non-blocking crossbar switch, and once access is granted to switch 211 execution happens immediately. Furthermore, because memory controller interface 212 is capable of operating at the rated frequency of crossbar 299, having communication to processor block 110 via one or more of DMAs 216 through 219 or one or more of SPLB interfaces 214 and 215, or a combination thereof, is facilitated by having memory controller interface 212 performance enhanced in comparison with other interface blocks of processor block 110, namely SPLB interfaces 214 and 215 and DMA interfaces 216 through 219. Moreover, performance level of memory controller interface 212 is substantially greater than circuits instantiated in CLBs or other programmable logic of FPGA fabric 290.

A master device, for example instantiated in FPGA fabric 290 or another ASIC core of FPGA 100, may be coupled to processor block 110 via an SPLB interface of SPLB interfaces 214 or 215 or a DMA interface of DMA interfaces 216 through 219. Memory controller interface 212 may be thought of as having only one slave device coupled to it, namely memory coupled to it via a memory controller. MPLB interface block 213 however is not limited to a single slave device, but may have multiple slave devices coupled to it. This is part of the reason for the slower frequency of operation of MPLB interface 213 in comparison to memory controller interface 212.

Other devices, such as other ASIC cores, other processors whether instantiated in FPGA fabric 290 or as ASIC cores, or other circuits whether ASIC cores or instantiated in FPGA fabric 290, may be coupled to processor block 110 via any of DMAs 216 through 219 or SPLB interfaces 214 or 215. It is not necessary that all transactions proceed to memory via memory controller interface 212. Thus, a device may be coupled for example to DMA interface 216 for executing a transaction utilizing a slave device, which may be a memory controller or a peripheral device, coupled to MPLB interface 213. Moreover, a master device coupled to SPLB interface 215 may issue a transaction to a slave device coupled to MPLB interface 213. It should, however, be understood that excluding transactions initiated by microprocessor 200, transactions from master devices coupled to any of DMA interfaces 216 through 219 or any of SPLB interfaces 214 and 215 go into crossbar 299 and then to either memory controller interface 212 or MPLB interface 213 to a memory controller or to one or more other slave devices, respectively, coupled thereto. Moreover, transactions may go from FPGA fabric 290 to memory controller interface 212 or MPLB interface 213 and then to any of local links 220-1 through 220-4 via DMA interfaces 216 through 219, respectively. In short, transactions go into and out of crossbar 299 and interfaces 298 of processor block 110, and thus crossbar 299 and interfaces 298 in combination may be thought of as a bridge or bridges.

It should be understood that outbound FIFOs 251 and 261 facilitate pipelining for adaptation to availability and relative transaction speed of slave devices coupled to memory controller interface 212 and MPLB interface 213, respectively.

Microprocessor 200 is a master device as it issues transactions for other devices. Furthermore, it should be appreciated that any transactions which originate via a master device coupled to any of DMA interfaces 216 through 219 or SPLB interfaces 214 and 215, or via microprocessor 200 exit processor block 110.

SPLB interfaces 214 and 215, like MPLB interface 213, are 128 bits wide and may be set to operate as 32- or 64-bit wide interfaces. In contrast, DMA interfaces 216 through 219 to FPGA fabric 290 are each 32 bits wide. Moreover, MPLB interface 213 and SPLB interfaces 214 and 215 are dynamic interfaces, as their bus width on a side associated with FPGA fabric 290 may be varied for coupling to a soft bus configured using PIPs of FPGA fabric 290; however, even though DMA interfaces 216 through 219 may be coupled to a soft bus configured using PIPs of FPGA fabric 290, their bus width is fixed at 32 bits.

FPGA fabric 290 operates much more slowly for example than crossbar 299. Thus, a five-to-two crossbar, rather than a nine-to-two crossbar, may be implemented, where all of DMA interfaces 216 through 219 are operating at full capacity without any apparent "dead cycle" or "bubble." Part of this implementation involves having interface blocks, such as DMA interfaces 216 through 219 and SPLB interfaces 214 and 215, accumulate a threshold amount of data before being granted access to switch 211. Local links 220-1 through 220-4 are dedicated interfaces, not soft buses, and there is no notion of address mapping for local links 220-1 through 220-4. There is flow control signaling for local links, such as ready/not ready signaling.

DMA interfaces 216 through 219 and SPLB interfaces 214 and 215 are "slave" interfaces. More particularly, DMA interfaces 216 through 219 are controlled via a DCR interface, described below in additional detail, for servicing microprocessor 200 or another master device coupled via such a DCR interface. SPLB interfaces 214 and 215 have coupled to them a master device, which is external to processor block 110, such as may be instantiated in FPGA fabric 290. However, memory controller interface 212 and MPLB interface 213 are "slave" interfaces with respect to microprocessor 200, DMA interfaces 216 through 219, and SPLB interfaces 214 and 215, as memory controller interface 212 and MPLB interface 213 each service microprocessor 200, and one or more master devices coupled via DMA interfaces 216 through 219 or SPLB interfaces 214 and 215.

Memory controller interface 212 and MPLB interface 213 are master interfaces with respect to "slave" devices coupled thereto via buses external to processor block 110.

It should be understood that within processor block 110 there are multiple clock domains. Microprocessor 200 has a separate clock domain from DMA interfaces 216 through 219 for example. MPLB interface 213 and memory controller interface 212 may have different clock domains each of which is different from the clock domains of SPLB interfaces 214 and 215. APU controller 206 may have two clock domains, namely one associated with microprocessor 200 and one associated with FCM interface 271. Moreover, crossbar 299 may have a time domain that extends into interfaces coupled to it and that extends to microprocessor 200. To further complicate timing, FPGA fabric 290 may have different time domains than some of those in processor block 110.

Figure 3:
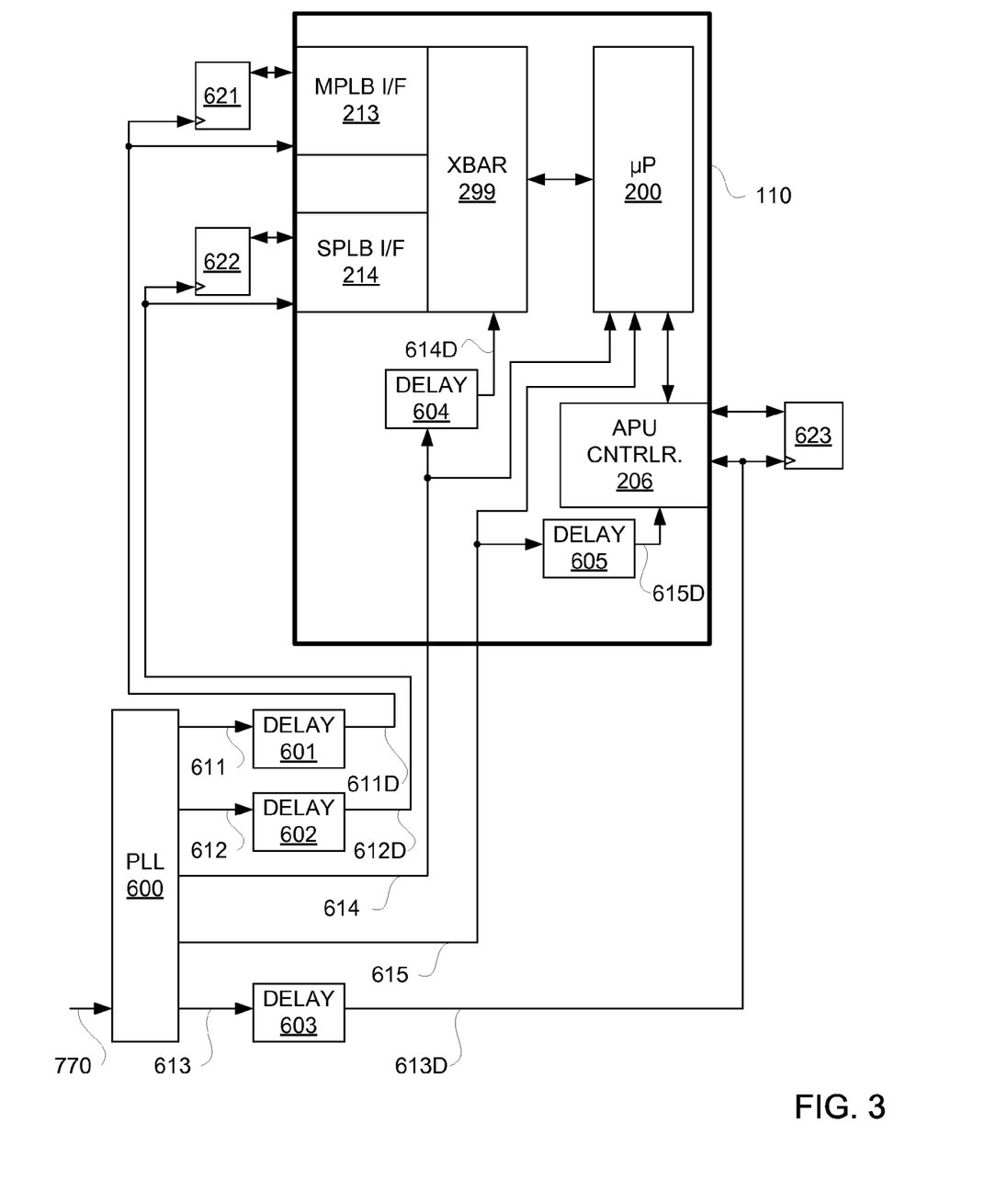
FIG. 3 is a block diagram depicting an exemplary embodiment of ASIC core clocking.

FIG. 3 is a block diagram depicting an exemplary embodiment of ASIC core clocking. Though the example of processor block 110 is used for an ASIC core, it should be appreciated that ASIC core clocking as described herein is not limited to processor block 110, but may be used for other ASIC cores embedded in a host IC.

As previously indicated, processor block 110 may be included in a host integrated circuit, such as FPGA 100 of FIG. 1. FPGA 100 of FIG. 1 may include a PLL 600 which receives an input clock signal 770. PLL 600 may be configured to generate plurality of clock signals, namely clock signals 611 through 613 using input clock signal 770. Clock signals 611 through 613 are provided as input to respective delays 601 through 603 to produce delayed clock signals 611D through 613D, respectively.

Clock signal 611D is provided to flip-flops of FPGA logic 621 instantiated in FPGA fabric 290 as well as to MPLB interface 213. Likewise, clock signal 612D is provided as input to one or more flip-flops of FPGA logic 622 instantiated in FPGA fabric 290 as well as SPLB interface 214. Interfaces of processor block 110 other than interfaces 213 and 214 may have clock signals provided to them from PLL 600 but are not described with reference to FIG. 3 for purposes of clarity and not limitation.

It should be understood that the timing associated with clock signals 611D and 612D reaching MPLB interface 213 and SPLB interface 214, respectively, is well defined due to use of clock trees in an FPGA 100. Likewise, the timing associated with receipt of clock signal 611D and 612D to FPGA logic 621 and 622, respectively, is likewise well defined in FPGA 100. Furthermore, the timing of signals between MPLB interface 213 and FPGA logic 621, as well the timing of signals between SPLB interface 214 and FPGA logic 622, is likewise well defined within the FPGA fabric environment.

Clock 613D may be provided as an input to both APU controller 206 and one or more flip-flops of FPGA logic 623. The timing at which clock signal 613D reaches APU controller 206 as well as reaches one or more flip-flops of FPGA logic 623 is well defined within FPGA 100. Likewise, the timing between signals from FPGA logic 623 to APU controller 206 is well defined within FPGA 100. By well defined, it should be understood that use of clock trees within FPGA 100 allow for signals to generally uniformly reach destinations within anticipated timing parameters.

In contrast, an ASIC core, such as processor block 110 may have clock insertion delay which is not as well defined. Blocks within processor block 110 may have longer clock insertion delay than other blocks therewithin. For example, microprocessor 200 may have a longer clock insertion delay than crossbar 299. Crossbar 299 may have a longer clock insertion delay than APU controller 206. Other blocks previously described with reference to processor block 110 have been omitted for purposes of clarity and not limitation with respect to FIG. 3; however, it should be understood that these other blocks may likewise have respective clock insertion delays that are different from one another.

In order to make some clocks appear early with respect to other clock signals, delays may be added as described herein. Clock signals 614 and 615 appear to arrive earlier to processor block 110 than delayed clock signals 611D through 613D even though such clock signals may be generated responsive to a same input clock 770. Moreover, delays 601 through 603 may be user programmable, where tap points of each of delays 601 through 603 is selectable. Thus, having programmable delay for delays 601 through 603 allows such respective delay of signals 611D through 613D to be tailored to an application.

Clock 614 is provided as an input to microprocessor 200 and as an input to internal path delay 604. Internal path delay 604 is to make the output clock therefrom, namely clock 614D, have a delay compensation which is associated with the difference between clock insertion delays of crossbar 299 and microprocessor 200. In other words, because microprocessor 200 has a longer clock insertion delay than crossbar 299, delay 604 is added in the internal path for providing clock signal 614D to crossbar 299 to compensate, namely to make the overall delay for crossbar 299 be closer to the overall delay for microprocessor 200.

While it may be possible to have the clock insertion delay of delay 604 and crossbar 299 equal the clock insertion delay of microprocessor 200, it is not necessary that such clock insertion delays be equal. In some instances it may be advantageous to have a difference in clock insertion delay, namely some skew. This skew may translate into skewing between set-up and clock-to-output times, which may be advantageous for performance reasons. However, compensation delay may be added such that set-up and clock-to-output times are approximately equal.

Likewise, clock 615 may be provided to microprocessor 200 and delay 605. Output of delay 605 may be clock 615D, and clock 615D may be provided to APU controller 206. Thus, delay 605 and APU controller 206 clock insertion delay may generally approximate clock insertion delay of microprocessor 200. Furthermore, because clock insertion delay of crossbar 299 is different from clock insertion delay of APU controller 206, namely greater, delay 605 may be greater than delay 604.

By adding delay in processor block 110, such as internal path delays 604 and 605, the clocks within the processor block can be balanced. Furthermore, synchronous operation internally within processor block 110 may be facilitated by having internal clocks of processor block 110 appear to be early such that synchronous operation with interface clocks, such as interface clocks 611D through 613D, may be obtained. Furthermore, it should be appreciated that delays 601 through 603 may be set to account for clock insertion delay within processor block 110 such that set-up and clock-to-output times are approximately equal to enhance performance.

Figure 4:
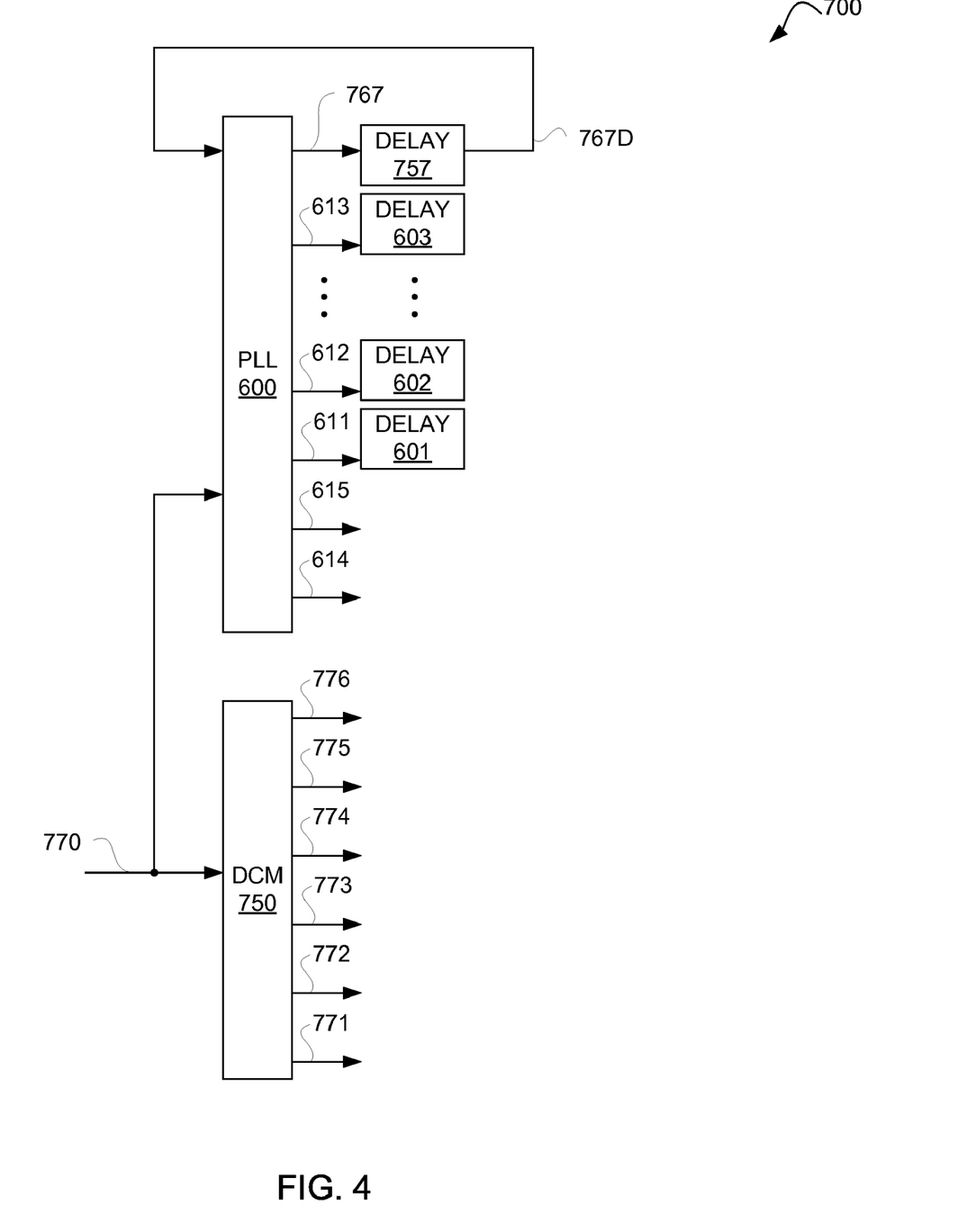
FIG. 4 is a block diagram depicting an exemplary embodiment of an FPGA internal clock signal generation circuit that may be used to generate clock signals for processor block of FIG. 3.

FIG. 4 is a block diagram depicting an exemplary embodiment of an FPGA internal clock signal generation circuit 700 that may be used to generate clock signals for processor block 110 of FIG. 3. A reference clock signal 770 is provided as an input to digital clock manager ("DCM") 750 and PLL 600. PLL 600 and DCM 750 exist as hardwired dedicated circuit blocks of an FPGA, such as a host FPGA 100.

DCM 750 may be configured to generate any of a variety of clock signals, such as clock signals 771 through 776 responsive to reference clock signal 770. For example, clock signal 771 may be reference clock signal 770 shifted by 180° by DCM 750. Moreover, clock signal 772 may be reference clock signal 770 shifted by 90° by DCM 750. Thus, it should be appreciated that clock signals of different phases may be provided by DCM 750 with reference to reference clock signal 770. Additionally, DCM 750 may be configured to pass reference clock signal 770 without any phase change, such as clock signal 776. DCM 750 may be configured to provide an integer multiple of reference clock signal 770, such as a 2× clock signal 775, namely twice the frequency of clock signal 770. Furthermore, DCM 750 may be configured to provide a non-integer multiple of the frequency of reference clock signal 770. For example, a 2.5 multiple ("2.5×") of the frequency of reference clock signal 770 may be provided as clock signal 774. Lastly, DCM 750 may be configured to divide the frequency of reference clock signal 770, such as by 2 for example, to provide a clock signal 773. Thus, it should be appreciated that any of a variety of clock signals may be provided from DCM 750.

However, if clock signals output from DCM 750 are to be provided to processor block 110 along with for example non-delayed clock signals 614 and 615 from PLL 600, then there may be misalignment. For example if multiple DCMs and PLLs are used, it may be desirable to have clocks all be aligned to one another but still have the opportunity to have clock signals 614 and 615 appear early. To provide such alignment, PLL 600 in addition to providing output clock signals 611 through 614 as previously described provides a feedback output clock signal 767. Feedback output clock signal 767 is provided to delay 757 to provide delayed feedback output clock signal 767D. Delayed feedback clock output signal 767D is fed back and provided as a feedback input to PLL 600. Responsive to delay of delayed feedback output 767D, PLL 600 internally delays clock signals 611 through 613. Even though only three delays 601 through 603 are shown for clock signals 611 through 613 to be delayed, it should be appreciated that fewer or more than three of such signals may be generated from PLL 600. Furthermore, fewer or more than two non-delayed signals may be generated from PLL 600. In this configuration, delayed clocks 611 through 613 will be in phase with input clock 770, and non-delayed clocks 614 and 615 will appear to be early.

Accordingly, it should be appreciated that without having a PLL added to an ASIC core such as processor block 110, delay has been described as being compensated for without having to slow down such ASIC core, for example microprocessor 200. In other words, delay is compensated for such that internal clocks of processor block 110 are not slowed but rather the edges of such clocks are merely delayed. It should be appreciated that the frequency with which flip-flops instantiated in FPGA fabric 290 may operate, such as in gasket logic 621 or 622 for example, is substantially slower than frequency of operation of crossbar 299 and microprocessor 200 for example. If crossbar 299 had to be slowed in order to have a synchronous interface like a pipelined interface for pipelining data to processor block 110, then a significant performance disadvantage may result. However, by having clocks appear early in processor block 110 to take up clock insertion delay, such overhead may be avoided.

For some applications, having zero or at least approximately zero hold time may be useful. Thus, a significant clock insertion delay associated with processor block 110 and a flip-flop instantiated in FPGA fabric 290, which may be right next to processor block 110, may not meet a zero hold time due to clock insertion delay as previously described, except for when delay compensation is used as described herein. Thus, by using delay compensation, hold times for flip-flops instantiated in FPGA fabric 290 may be at or near zero seconds.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for clock insertion delay compensation, comprising:
embedding a hardwired core in a host integrated circuit;
operating a first clock domain in the hardwired core with a first frequency that is equal to or greater than a second frequency of operation of a second clock domain in the host integrated circuit but external to the hardwired core;
interfacing programmable resources with one or more flip-flops in the second clock domain with the hardwired core;
the host integrated circuit including a phase-locked loop ("PLL") that is located external to the hardwired core, the PLL coupled to receive a reference clock signal and configured to generate a first plurality of clock signals;
sending a first clock signal of the first plurality of clock signals associated with the second clock domain to the programmable resources;
sending a second clock signal of the first plurality of clock signals associated with the first clock domain to the hardwired core; and
making the second clock signal appear to be produced earlier in time than the first clock signal with respect to the hardwired core to compensate for a first clock insertion delay of the hardwired core;
wherein the making of the second clock signal to appear to be produced earlier in time includes delaying edges of the first clock signal; and
wherein a clock-to-output time associated with the one or more flip-flops at least approximates zero.

2. The method according to claim 1, wherein the delaying of the edges of the first clock signal provided to the programmable resources is by an amount that at least approximates the first clock insertion delay.

3. The method according to claim 2, wherein the delaying includes setting a tap point of a programmable delay to provide the amount.

4. The method according to claim 3, wherein the one or more flip-flops are located in programmable logic.

5. The method according to claim 4, wherein the host integrated circuit is a programmable logic device.

6. The method according to claim 3, wherein the hardwired core is a processor block having a microprocessor, a crossbar switch device, and a plurality of interfaces.

7. The method according to claim 6, wherein the first clock insertion delay is associated with the microprocessor.

8. The method according to claim 7, wherein the crossbar switch device is in the first time domain and has associated therewith a second clock insertion delay.

9. The method according to claim 8, further comprising adding a first path insertion delay between the second clock signal and the crossbar switch device to adjust the second clock insertion delay to at least be approximately equal to the first clock insertion delay.

10. The method according to claim 9, wherein an interface of the plurality of interfaces is in a third time domain and has associated therewith a third clock insertion delay and a third frequency of operation, the third frequency of operation being between the first frequency of operation and the second frequency of operation, and the third clock insertion delay being less than the second clock insertion delay.

11. The method according to claim 8, further comprising adding a second path insertion delay between the third clock signal and the interface to adjust the third clock insertion delay to at least be approximately equal to the first clock insertion delay.

12. The method according to claim 1, further comprising:
receiving the reference clock signal by a digital clock manager in the host integrated circuit but external to the hardwired core;
generating a second plurality of clock signals with the digital clock manager responsive to the reference clock signal;
generating with the PLL a feedback output clock signal as part of the first plurality of clock signals; and
delaying the feedback output clock signal to provide a delayed version thereof for feedback input to the PLL.

13. The method according to claim 12, wherein:
the first plurality of clock signals include frequencies that are not integer multiples of a frequency of the reference clock signal; and
the second plurality of clock signals include frequencies that are integer multiples of the frequency of the reference clock signal.

14. A circuit, comprising: a hardwired core embedded in a host integrated circuit; programmable resources having one or more flip-flops coupled to the hardwired core; a digital clock manager and a phase-locked loop ("PLL") located in the host integrated circuit but external to the hardwired core; the digital clock manager and the PLL each coupled to receive a reference clock signal and configured to respectively generate a first plurality of clock signals and a second plurality of clock signals; the PLL configured to provide a first clock signal of the second plurality of clock signals; a first delay coupled to delay the first clock signal to provide a delayed version thereof for feedback input to the PLL; a second delay coupled to delay a second clock signal of the second plurality of clock signals; the second delay coupled to delay the second clock signal to provide a delayed version thereof for input to the programmable resources; a third clock signal of the second plurality of clock signals provided for input to the hardwired core; and the second delay being programmable for setting a delay thereof to at least approximate clock insertion delay of the third clock signal in the hardwired core.

15. The circuit according to claim 14, wherein hold time of the one or more flip-flops is at least approximately zero.

16. The circuit according to claim 15, wherein the programmable resources are is instantiated in programmable logic.

17. The circuit according to claim 16, wherein the host integrated circuit is a programmable logic device.

* * * * *